(12) United States Patent
Doornbos et al.

(10) Patent No.: US 9,711,632 B2
(45) Date of Patent: Jul. 18, 2017

(54) INTRA-BAND TUNNEL FET

(71) Applicant: Taiwan Semiconductor Manufacturing Co. Ltd., Hsin-Chu (TW)

(72) Inventors: Gerben Doornbos, Leuven (BE); Krishna Kumar Bhuwalka, Leuven (BE)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 274 days.

(21) Appl. No.: 13/863,489

(22) Filed: Apr. 16, 2013

(65) Prior Publication Data
US 2014/0264277 A1    Sep. 18, 2014

Related U.S. Application Data

(60) Provisional application No. 61/778,634, filed on Mar. 13, 2013.

(51) Int. Cl.
*H01L 29/775* (2006.01)
*H01L 29/66* (2006.01)
*H01L 29/06* (2006.01)
*B82Y 10/00* (2011.01)
*B82Y 40/00* (2011.01)
*H01L 29/739* (2006.01)
*H01L 29/20* (2006.01)

(52) U.S. Cl.
CPC ............ *H01L 29/775* (2013.01); *B82Y 10/00* (2013.01); *B82Y 40/00* (2013.01); *H01L 29/068* (2013.01);
(Continued)

(58) Field of Classification Search
CPC ... B82Y 10/00; B82Y 40/00; H01L 29/66356; H01L 29/66469; H01L 29/7391;
(Continued)

(56) References Cited

U.S. PATENT DOCUMENTS 5,504,347 A * 4/1996 Jovanovic .............. B82Y 10/00
257/24
2010/0102298 A1* 4/2010 Wu ...................... H01L 27/0605
257/25
(Continued)

OTHER PUBLICATIONS

"Imec—Tunnel FETs"; IMEC Scientific Report 2011; http://www.imec.be.ScientificReport/SR2011/1414174.html; p. 1-7.
(Continued)

*Primary Examiner* — Peniel M Gumedzoe
(74) *Attorney, Agent, or Firm* — Eschweiler & Potashnik, LLC

(57) ABSTRACT

The present disclosure relates to an intra-band tunnel FET, which has a symmetric FET that is able to provide for a high drive current. In some embodiments, the disclosed intra-band tunnel FET has a source region having a first doping type and a drain region having the first doping type. The source region and the drain region are separated by a channel region. A gate region may generate an electric field that varies the position of a valence band and/or a conduction band in the channel region. By controlling the position of the valence band and/or the conduction band of the channel region, quantum mechanical tunneling of charge carries between the conduction band in the source region and in the drain region or between the valence band in the source region and in the drain region can be controlled.

21 Claims, 6 Drawing Sheets

(52) U.S. Cl.
CPC ...... *H01L 29/0673* (2013.01); *H01L 29/0676* (2013.01); *H01L 29/66356* (2013.01); *H01L 29/66469* (2013.01); *H01L 29/7391* (2013.01); *H01L 29/20* (2013.01)

(58) Field of Classification Search
CPC ............... H01L 29/775; H01L 29/0673; H01L 29/0676; H01L 29/068; H01L 29/20
See application file for complete search history.

(56) References Cited

U.S. PATENT DOCUMENTS

| | | | | |
|---|---|---|---|---|
| 2012/0241722 | A1* | 9/2012 | Ikeda | H01L 27/1203 257/19 |
| 2013/0307025 | A1* | 11/2013 | Pal | H01L 29/7831 257/192 |
| 2014/0291616 | A1* | 10/2014 | Park | H01L 29/66356 257/27 |

OTHER PUBLICATIONS

Sumeet Kumar Gupta, et al.; "Dopant Straggle-Free Heterojunction Intra-band Tunnel (HIBT) FETs with Low Drain-induced Barrier Lowering/Thinning (DIBL/T) and Reduced Variation in OFF Current"; Intel Corporation, Hillsboro, OR, Penn. State University Park USA, Jun. 18, 2012, p. 1-2.

Dewey, at al. "Fabrication, Characterization, and Physics of III-V Heterojunction Tunneling Field Effect Transistors (H-TFET) for Steep Sub-Threshold Swing." Electron Devices Meeting (IEDM), 2011 IEEE International. Dec. 5-7, 2011.

Zhou, et al. "Novel gate-recessed vertical InAs/GaSb TFETs with record high ION of 180 μA/μm at VDS = 0.5 V." Electron Devices Meeting (IEDM), 2012 IEEE International. Dec. 10-13, 2012.

* cited by examiner

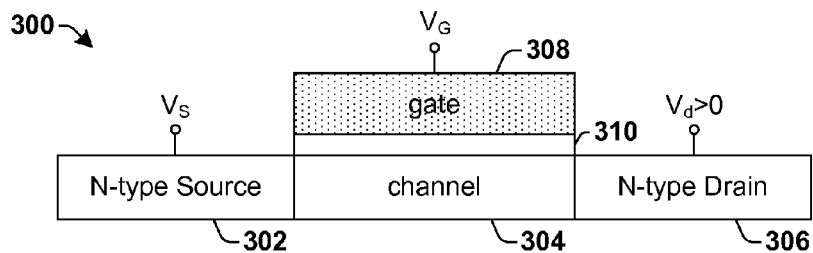
Fig. 3A
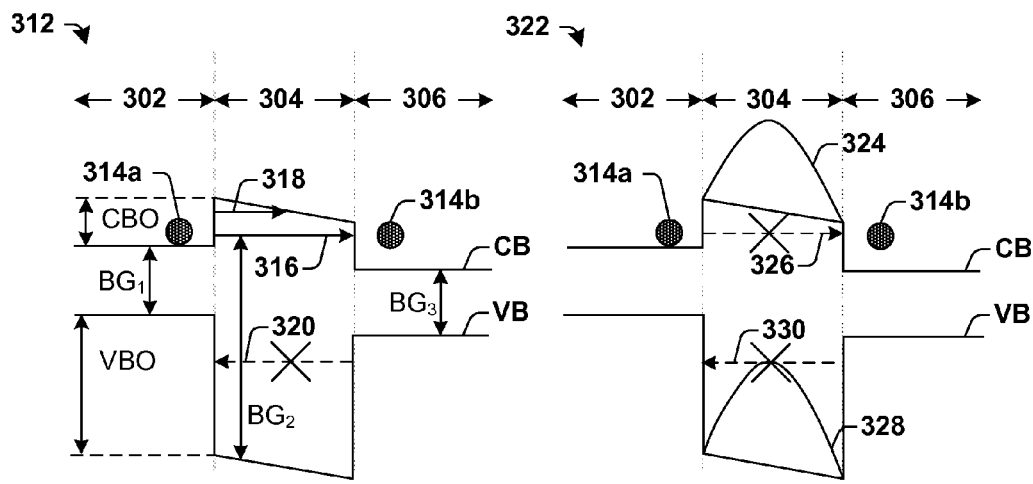
Fig. 3B
| Lattice Constant (A) | S/D (n-type) | Channel | CBO(eV) | VBO(eV) |
|---|---|---|---|---|
| 5.65 (GaAs) | GaAs | AlAs | 0.2 | 0.5 |
| 5.65 (GaAs) | GaAs | ZnSe | 0.2 | 0.9 |
| 5.87 (InP) | GaAsSb | InP | 0.1 | 0.5 |
Fig. 3C

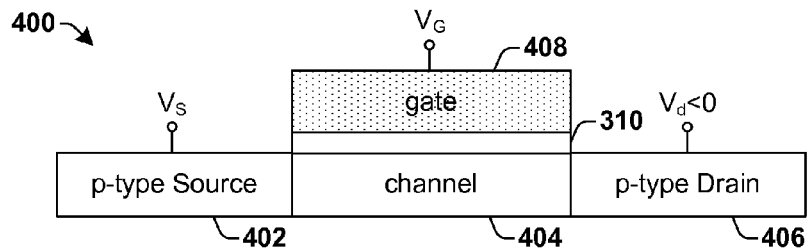
Fig. 4A
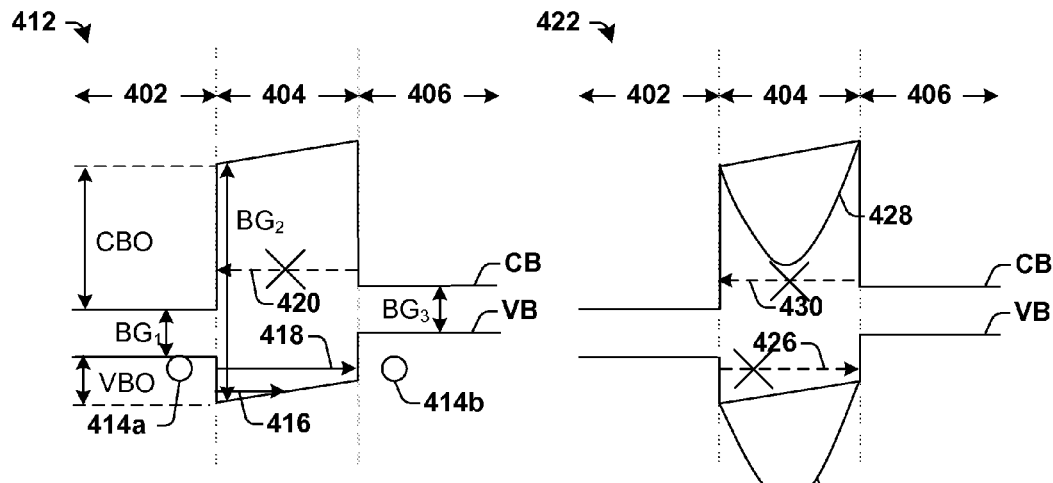
Fig. 4B
| Lattice Constant (A) | S/D (n-type) | Channel | CBO(eV) | VBO(eV) | |
|---|---|---|---|---|---|
| 5.87 (InP) | InAlAs | InP | >0.5 | 0.1 | ←434 |
| 6.06 (InAs) | InAs | AlAsSb | 0.9 | 0.1 | ←436 |
| 6.06 (InAs) | InAs | InP(strained) | 0.6 | 0.1 | ←438 |
Fig. 4C

INTRA-BAND TUNNEL FET

REFERENCE TO RELATED APPLICATION

This application is a Non-Provisional application claiming priority to Provisional Application Ser. No. 61/778,634 filed on Mar. 13, 2013 entitled "Intra-Band Tunnel FET" in the name of Gerben Doornbos and Krishna Kumar Bhuwalka and is hereby incorporated by reference.

BACKGROUND

Field effect transistors (FETs) are widely used in integrated chips. FETs comprise a source, a drain, and a gate. By applying a bias voltage to the gate, current flow between the source and the drain can be controlled. The subthreshold drain current of a FET is the current that flows between the source and drain of a FET when the transistor is in subthreshold region (i.e., for gate-to-source voltages below the threshold voltage). A large subthreshold slope (i.e., a small subthreshold swing) is typically desired since it improves the ratio between on and off currents, and therefore reduces leakage currents.

As the semiconductor industry is reducing the size of transistors, it is also reducing supply voltages to reduce the power dissipation and to maintain reliability of devices. Reducing the supply voltage reduces a gate voltage swing between on and off states of a device. To prevent a reduction in performance the threshold voltage may be decreased. However, the threshold voltage reduction is a function of the subthreshold drain current, and therefore is limited according to the finite nature of the subthreshold swing.

BRIEF DESCRIPTION OF THE DRAWINGS

FIGS. 3A-3C illustrates some embodiments of an n-type intra-band tunnel FET.

FIGS. 4A-4C illustrates some embodiments of a p-type intra-band tunnel FET.

DETAILED DESCRIPTION

Figure 1:
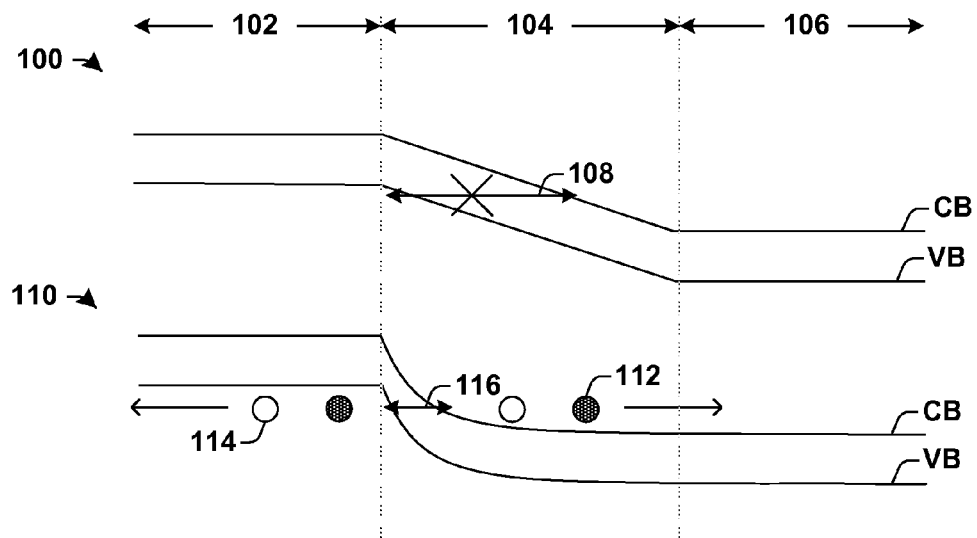
FIG. 1 illustrates band diagrams showing energy band diagrams for an inter-band tunnel field effect transistor (FET) during an on-state and an off-state.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Downscaling of CMOS technology is currently facing challenges due to the non-scalability of the subthreshold slope (SS) of metal-oxide-semiconductor field effect transistor (MOSFET) devices. A device characterized by steep subthreshold slope exhibits a fast transition between off and on states and a scalable supply voltage. However, traditional MOSFET devices are limited in their subthreshold slope due to a temperature dependency (i.e., subthreshold swing is limited by KT/q to approximately 60 mV/dec at room temperature).

In a classical FET, the subthreshold swing can never be smaller than the thermal limit of about 60 mV/decade at room temperature. In FETs where switching is induced by quantum-mechanical tunneling, this thermal limit can be surpassed. Therefore, inter-band tunnel FETS, which operate based upon quantum mechanical tunneling, have emerged as a potential alternative to traditional MOSFET transistors. Inter-band tunnel FETs have a low subthreshold swing that is temperature independent, thereby allowing for high switching speeds and supply voltage scaling. Inter-band tunnel FETs comprise a PIN diode having a source region having a first doping type and a drain region having a second doping type, opposite the first doping type. A channel region is located between the source region and the drain region and a gate region is located over the channel region. The source region, the channel region, and the drain region may have a same size bandgap, such that the channel region forms a homojunction with the source region and the drain region.

FIG. 1 illustrates band diagrams, 100 and 110, showing operation of an inter-band tunnel FET. Electron-hole pairs, comprising an electron 112 and a hole 114, form within the source region 102 and the drain region 106 of the inter-band FET.

As shown in band diagram 100, in an "off-state" charge carriers (i.e., electrons 112 and holes 114) are unable to tunnel from the source region 102 to the drain region 106, since an energy barrier in the channel region 104 is too wide for band-to-band tunneling 108 between the conduction band CB and the valence band VB. However, when an appropriate bias voltage (e.g., a large positive bias voltage) is applied to a gate terminal an electric field is generated, which bends the conduction band CB and the valence band VB within the channel region 104 reducing a width of the energy barrier and changing the inter-band TFET to an "on-state." In the on-state charge carriers quantum-mechanically tunnel 116 between the valence band (VB) of the source region 102 and the conduction band (CB) of the drain region 106. The electrons 112 are driven to the right and the holes 114 are driven to the left, both contributing the drive current of the inter-band FET.

While inter-band tunnel FETs have a temperature independent subthreshold slope, inter-band tunnel FETs face fundamental limits to drive current due to low tunneling rates (e.g., less than 30%) between the valence band VB and the conduction band CB. Furthermore, inter-band tunnel FETs are intrinsically asymmetric, so that the source region and the drain region cannot be swapped. The asymmetry of the inter-band tunnel FETs imposes design limitations on the use of inter-band tunnel FETs.

Accordingly, the present disclosure relates to an intra-band tunnel FET, which comprises a symmetric tunnel FET that is able to provide for a high drive current. In some embodiments, the disclosed intra-band tunnel FET comprises a source region having a first doping type and a drain region having the first doping type. The source region and the drain region are separated by a channel region. A gate region is configured to generate an electric field that varies the position of a valence band and/or a conduction band in the channel region. By controlling the position of the valence band and/or the conduction band in the channel region, quantum mechanical tunneling of charge carries between the conduction band in the source region and in the drain region or between the valence band in the source region and in the drain region can be controlled.

Figure 2:
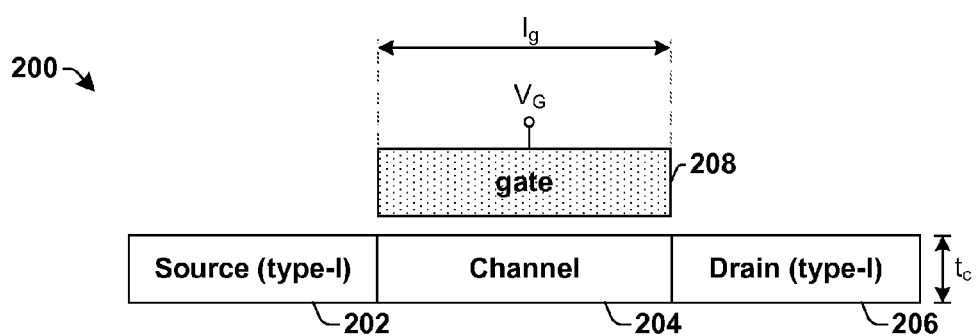
FIG. 2 illustrates a block diagram of some embodiments of a disclosed intra-band tunnel FET.

FIG. 2 illustrates a block diagram of some embodiments of a disclosed intra-band tunnel field effect transistor (FET) 200.

The intra-band tunnel FET 200 comprises a source region 202 and a drain region 206. The source region 202 and drain region 206 have a first doping type (e.g., an n-type doping or a p-type doping). In some embodiments, the source region 202 and the drain region 206 may comprise a same material with a first doping type. A channel region 204 is disposed between the source region 202 and the drain region 206, resulting in a symmetric tunnel FET (since the source region 202 and the drain region 206 are a same doping type). In some embodiments, the channel region 204 may comprise an intrinsically doped semiconductor material having no significant dopant species present. In other embodiments, the channel region 204 may comprise a semiconductor material having the first doping type (e.g., to form an N+/N/N+ device). In other embodiments, the channel region 204 may comprise a semiconductor material having a second doping type (e.g., a p-type doping or an n-type doping), different than the first doping type.

A gate region 208 is configured to control the flow of charge carriers located position between the source region 202 and the drain region 206. In some embodiments, the gate region 208 may have a gate length $I_g$, which extends along a direction that is parallel to the direction that charge carriers flow in the channel region 204, having a range of between approximately 4 nm and approximately 10 nm. In some embodiments, the channel region 204 has a thickness $t_c$ that is in a range of between approximately 4 nm and approximately 40 nm.

In some embodiments, the channel region 204 has a first bandgap, while the source region 202 and the drain region 206 have bandgaps that are smaller than the first bandgap of the channel region 204. The different bandgap of the channel region 204 results in a double heterojunction between the source region 202 and channel region 204 and between the channel region 204 and the drain region 206. In some embodiments, the source region 202 and the drain region 206 have a same bandgaps. In other embodiments, the source region 202 and the drain region 206 may have different bandgaps, which are different than the first bandgap.

The energy bands of the source region 202, the channel region 204 and the drain region 206 have characteristics (e.g., band gaps and Fermi levels) that form an energy barrier between the source region 202 and the drain region 206. The energy barrier is asymmetric such that is has a first offset value for a conduction band (i.e., a conduction band offset) and a different, second offset value for a valence band (i.e., a valence band offset). In some embodiments, the conduction band offset is at least twice as large as the valence band offset. For example, the conduction band offset may have a value of greater than 0.5 eV (electron-volt), while the valence band offset may have a value of between 0.1 eV and 0.2 eV. In other embodiments the valence band offset is at least twice as large as the conduction band offset. For example, the conduction band offset may have a value of between 0.1 eV and 0.2 eV, while the valence band offset may have a value of greater than 0.5 eV.

A gate contact is configured to selectively provide a gate voltage $V_G$ to the gate region 208. The gate voltage $V_G$ causes the gate region 208 to generate an electric field that controls the position-dependent energies of the conduction band and/or valence band within the channel region 204. By controlling the conduction band, the electron energy barriers between the source and drain can be varied. By controlling the valence band, hole energy barriers between the source and drain can be varied.

The conduction band offset and the valence band offset correspond to a size of the energy barriers for electrons and holes, respectively, between the source region 202 and the drain region 206. By varying the size of the energy barriers, tunneling of charge carriers between regions of a band can be controlled. For example, tunneling of electrons between a source region and a drain region of a conduction band can be controlled or tunneling of holes between a source region and a drain region of a valence band can be controlled. Controlling the tunneling between regions of a band enables the intra-band tunneling FET to pass charge carriers by way of intra-band tunneling (i.e., tunneling within a conduction band or tunneling within a valence band), which provides for high tunneling rates that give a high drive current.

FIGS. 3A-3C illustrates some embodiments of an n-type intra-band tunnel FET.

FIG. 3A illustrates some embodiments of a block diagram of an n-type intra-band tunnel FET 300. The intra-band tunnel FET 300 comprises a source region 302 having an n-type doping and a drain region 306 having an n-type doping. A channel region 304 is located between the n-type source region 302 and the n-type drain region 306. In some embodiments, a source bias voltage $V_s$ having a value of zero may be applied to the source region 302 and a drain bias voltage $V_d$ having a value greater than zero may be applied to the drain region 306.

In some embodiments, the source region 302 and the drain region 306 are configured to have a similar lattice constant to the channel region 304. For example, the source region 302 and the drain region 306 may be lattice matched (i.e., have a same lattice constant) with the channel region 306. By maintaining a similar lattice constant between the source region 302/drain region 306 and the channel region 304, strain in the channel region 304 is reduced, mitigating defects in the channel region 304.

In some embodiments, the source region 302, the drain region 306, and the channel region 304 may comprise a compound having two or more elements. For example, in some embodiments, the source region 302, the drain region 306, and the channel region 304 may comprise binary compounds (e.g., comprising two semiconductor elements). The use of binary compounds allows for the lattice constant of the source, drain, and/or channel regions to be varied in a controlled manner by varying a concentration of one of the two semiconductor elements. This enables lattice matching to be achieved between the source region 302, the drain region 306, and the channel region 304. In other embodiments, one or more of the source region 302, the drain region 306, and/or the channel region 306 may comprise binary compound, while other regions may comprise a tertiary compound (e.g., comprising three semiconductor elements). For example, the source region 302 and the drain region 306 may comprise a tertiary compound, while the channel region 304 may comprise a binary compound, or vice versa.

A gate region 308 is located over channel region 304 at a position between the source region 302 and the drain region 306. The gate region 308 is configured to generate an electric field that varies the conduction band energy and the valence band energy within the channel region 204. In some embodiments, the gate region 308 may comprise a metal gate comprising aluminum, chromium, titanium, or a similar metal. In other embodiments, the gate region 308 may comprise a polysilicon gate material.

In some embodiments, a gate dielectric layer 310 is disposed between the channel region 304 and the gate region 308. In some embodiments, the gate dielectric layer 310 may comprise an oxide (e.g., aluminum oxide ($Al_2O_3$), hafnium oxide ($HfO_2$), tantalum oxide ($Ta_2O_5$), etc.).

FIG. 3B illustrates band diagrams, 312 and 322, showing operation of the n-type intra-band tunnel FET 300. As shown in band diagrams, 312 and 322, the source region 302 has a first band gap $BG_1$, the channel region 304 has a second band gap $BG_2$, and the drain region 306 has a third band gap $BG_3$. The first and third bandgaps, $BG_1$ and $BG_3$, are smaller than the second bandgap $BG_2$.

Band diagram 312 illustrates n-type intra-band tunnel FET 300 in an "on-state." In the on-state, a conduction band offset CBO, equal to the potential difference between the conduction band CB in the source region 302 and/or the drain region 306 and the conduction band CB in the channel region 304, is relatively small (e.g., between 0.1 eV and 0.2 eV). The relatively small conduction band offset CBO allows for electrons 314 to quantum mechanically tunnel 316, 318 between the conduction band CB in the source region 302 and the conduction band CB in the drain region 306, by way of the channel region 304, at a high tunneling rate.

In various embodiments, the electrons 314 in the conduction band CB may quantum mechanically tunnel by way of direct tunneling 316 and/or by way of Fowler Nordheim tunneling 318 depending upon a length of the channel region 304. In direct tunneling 316, electrons 314 tunnel in the presence of an electric field from the source region 302 to the drain region 306 through the entire length of the channel region 304. In Fowler Nordheim tunneling 318, the electrons 314 tunnel in the presence of an electric field from the source region 302 through a part of the channel region 304 to the conduction band of the channel region 304, from where the electrons 314 flow to the drain region 306.

In the on-state, a valence band offset VBO, equal to the potential difference between the valence band VB in the source region 302 and/or the drain region 306 and the valence band VB in the channel region 304 is relatively large, (i.e., greater than 0.5 eV). The relatively large valence band offset VBO prevents holes from quantum mechanically tunneling 320 between the source region 302 and the drain region 306 (i.e., so that electrons act as charge carriers in the n-type intra-band tunnel FET 300).

As shown in band diagram 322, in an "off-state", a negative gate bias is applied to the gate region 308, generating an electric field that changes the position of the conduction band CB and the valence band VB in the channel region 304. The change in the position of the conduction band CB changes the height of an electron energy barrier (according to line 324) between the source region 302 and the drain region 406, so that the electron energy barrier becomes relatively large. The relatively large electron energy barrier prevents electrons 314 from quantum mechanically tunneling 326 between the source region 302 and the drain region 306. The change in the position of the valence band CB changes the shape of the hole energy barrier (according to line 328), however the two separate barriers that remain continue to prevent holes from quantum mechanically tunneling between the source region 302 and the drain region 306.

FIG. 3C illustrates a chart 332 showing some embodiments of materials that can be used for the source region 302, the channel region 304, and the drain region 306 of the p-type intra-band tunnel FET 300.

In some embodiments, shown in row 334, the source region and the drain region may comprise n-doped gallium arsenide (GaAs), while the channel region comprises aluminum arsenide (AlAs). The n-doped GaAs has a lattice constant of 5.65 angstroms. The AlAs has a similar lattice constant of 5.66 angstroms, thereby reducing strain and defects between the source region 302 and the channel 304 and/or between the drain region 306 and the channel region 304. Such materials provide for a conduction band offset of 0.2 eV and a valance band offset of 0.5 eV, thereby providing for a larger valence band offset than conduction band offset.

In other embodiments, shown in row 336, the source region and the drain region may comprise n-doped gallium arsenide (GaAs), while the channel region comprises zinc selenide (ZnSe). The n-doped GaAs has a lattice constant of 5.65 angstroms. The ZnSe has a similar lattice constant of 5.66 angstroms. Such materials provide for a conduction band offset of 0.2 eV and a valance band offset of 0.9 eV, thereby providing for a larger conduction band offset than valence band offset.

In other embodiments, shown in row 338, the source region and the drain region may comprise gallium arsenide antimonide (GaAsSb), while the channel region comprises indium phosphide (InP). The n-doped GaAsSb can have, depending on As/Sb ratio, a lattice constant of about 5.87 angstroms. The InP has a similar lattice constant of 5.87 angstroms. Such materials provide for a conduction band offset of 0.1 eV and a valance band offset of 0.5 eV, thereby providing for a larger conduction band offset than valence band offset.

FIGS. 4A-4C illustrates some embodiments of a p-type intra-band tunnel FET.

FIG. 4A illustrates some embodiments of a block diagram of a p-type intra-band tunnel FET 400. The p-type intra-band tunnel FET 400 comprises a source region 402 having a p-type doping concentration and a drain region 406 having a p-type doping concentration. A channel region 404 is located between the p-doped source region 402 and the p-doped drain region 406. In some embodiments, a source bias voltage $V_s$ having a value of zero may be applied to the source region 402 and a drain bias voltage $V_d$ having a value less than zero may be applied to the drain region 406.

A gate region 408 is located over channel region 404 at a position between the source region 402 and the drain region 406. The gate region 408 is configured to generate an electric field, based upon a bias voltage $V_G$, which varies the conduction band energy and the valence band energy within the channel region 404. In some embodiments, the gate region 408 may comprise a metal gate comprising aluminum or titanium. The gate region may be separated from the channel region 404 by way of a gate dielectric layer 410. In some embodiments, the gate dielectric layer 410 may comprise an oxide (e.g., $Al_2O_3$ and/or $HfO_2$).

FIG. 4B illustrates band diagrams, 412 and 422, showing operation of the p-type intra-band tunnel FET 400. As shown in band diagrams, 412 and 422, the source region 402 has a first band gap $BG_1$, the channel region 404 has a second band gap $BG_2$, and the drain region 406 has a third band gap $BG_3$. The first and third bandgaps, $BG_1$ and $BG_3$, are smaller than the second bandgap $BG_2$.

Band diagram 412 illustrates p-type intra-band tunnel FET 400 in an "on-state." In the on-state, a valence band offset VBO, equal to the potential difference between the valence band VB in the source region 402 and/or the drain region 406 and the valence band VB in the channel region 404, is relatively small (e.g., between 0.1 eV and 0.2 eV). The relatively small valence band offset VBO allows for holes 414 to quantum mechanically tunnel 416, 418 between the valence band in the source region 402 and the valence band in the drain region 406, by way of the channel region 404, at a high tunneling rate (i.e., so that holes act as charge carriers in the p-type intra-band tunnel FET 400). In various embodiments, the holes 414 may quantum mechanically tunnel by way of direct tunneling 418 and/or by way of Fowler Nordheim tunneling 416 depending upon a length of the channel region.

Band diagram 412 also illustrates a conduction band offset CBO, equal to the potential difference between the conduction band CB in the source region 402 and/or the drain region 406 and the conduction band CB in the channel region 404. The conduction band offset CBO between the source region 402 and the channel region 404 and between the drain region 406 and the channel region 404 is relatively large (i.e., larger than the VBO). The relatively large conduction band offset CBO prevents electrons from quantum mechanically tunneling 420 between the source region 402 and the drain region 406.

As shown in band diagram 422, in an "off-state", an electric field generated by the gate region 408 changes the position of the valence band VB and the conduction band CB in the channel region 404. The change in the position of the valence band VB changes the height of the hole energy barrier between the source region 402 and the drain region 406 (according to line 424), so that the hole barrier height is relatively large (e.g., greater than 0.5 eV). The relatively large hole barrier height prevents holes 414 from quantum mechanically tunneling 426 between the source region 402 and the drain region 406. The change in the position of the conduction band CB also changes the shape of the electron energy barrier (according to line 428), however the two separate barriers that remain continue to prevent electrons from quantum mechanically tunneling between the source region 402 and the drain region 406.

FIG. 4C illustrates a chart 432 showing some embodiments of materials that can be used for the source region 402, the channel region 404, and the drain region 406 of the p-type intra-band tunnel FET 400.

In some embodiments, shown in row 434, the source region and the drain region may comprise p-doped indium aluminum arsenide (InAlAs), while the channel region comprises indium phosphide (InP). The p-doped InAlAs can have, depending on In/Al ratio, a lattice constant that is similar to that of InP, which has a lattice constant of 5.87 angstroms. Such materials provide for a conduction band offset of greater than 0.5 eV and a valance band offset of 0.1 eV, thereby providing for a larger conduction band offset than valence band offset.

In other embodiments, shown in row 436, the source region and the drain region may comprise p-doped indium arsenide (InAs), while the channel region comprises aluminum arsenide antimonide (AlAsSb). The p-doped InAs has a lattice constant of 6.06 angstroms, which can be similar to the lattice constant of AlAsSb depending on As/Sb ratio. Such materials provide for a conduction band offset of 0.9 eV and a valance band offset of approximately 0.1 eV, thereby providing for a larger conduction band offset than valence band offset.

In other embodiments, shown in row 438, the source region 402 and the drain region 406 may comprise p-doped indium arsenide (InAs), while the channel region comprises strained indium phosphide (InP). The p-doped InAs has a lattice constant of 6.06 angstroms. The InP has a lattice constant of 5.87 angstroms, which forms a strained InP channel on an InAs source or drain. The strained InP material forms a relatively thin channel region (e.g., between approximately 4 nm and 10 nm). Such materials provide for a conduction band offset of 0.6 eV and a valance band offset of 0.1 eV, thereby providing for a larger conduction band offset than valence band offset.

Figure 5A:
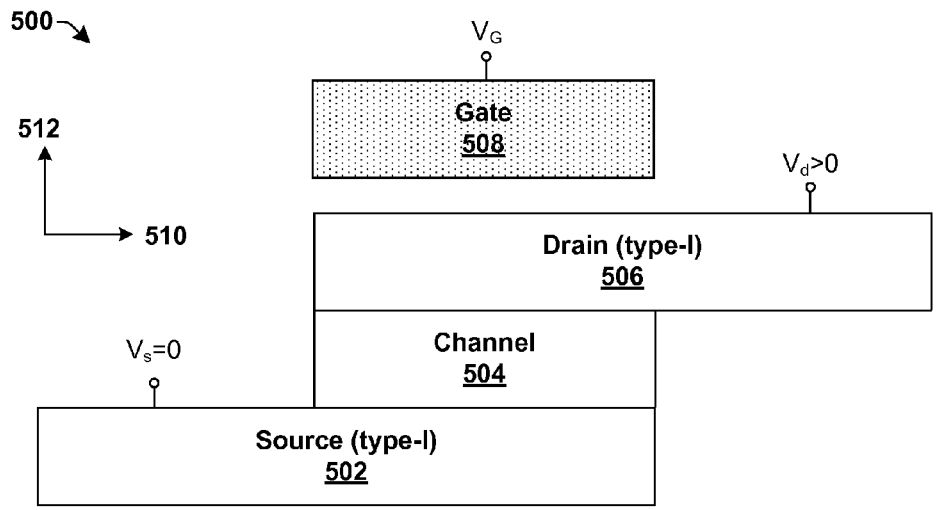
FIGS. 5A-5B illustrates some embodiments of a disclosed intra-band tunnel FET configured to perform line tunneling.
Figure 5B:
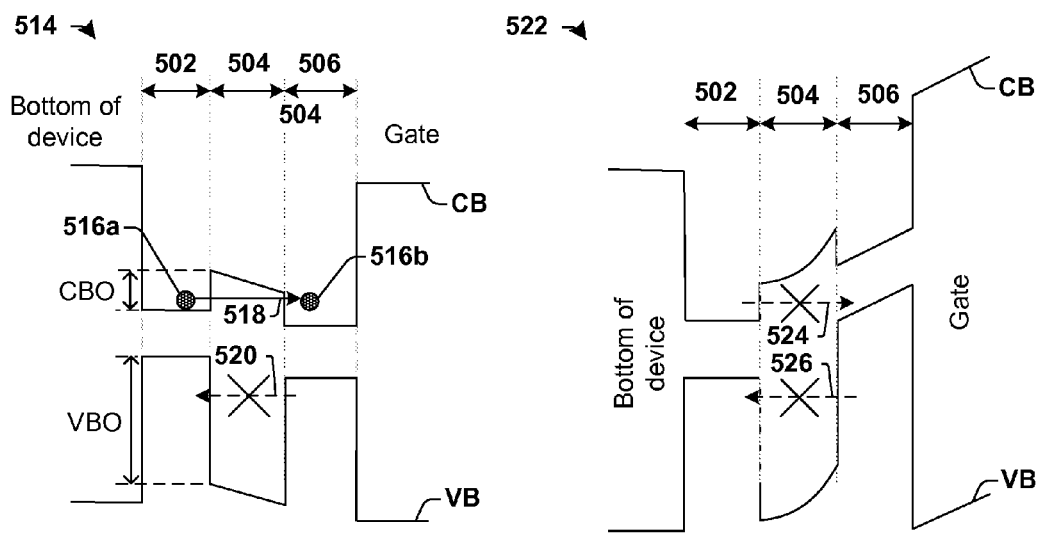

FIGS. 5A-5B illustrates some embodiments of a disclosed intra-band tunnel FET 500 configured to perform line tunneling.

Intra-band tunnel FET 500 comprises a source region 502, a channel region 504, and a drain region 506. The channel region 504 is situated on the source region 502, and the drain region 506 is situated on the channel region 504. In some embodiments, a gate region 508 is positioned over the drain region 506, so that the gate region 508 is located at a position that is separated from the channel region 504 by the drain region 506. In other embodiments, the gate region 508 may be positioned under the source region 502, so that the gate region 508 is located at a position that is separated from the channel region 504 by the source region 502.

As shown in intra-band tunnel FET 500, the gate region 508 is configured to generate an electric field that extends through the drain region 506 and the channel region 504. Since the gate region 508 is positioned over the drain region 506 the electric field changes the position of the conduction band and the valence band in the drain region 506 and the channel region 504. The electric field enables quantum mechanical tunneling in intra-band tunnel FET 500 in a direction that is perpendicular to the gate length. For example, in FIG. 5A the gate length extends along a first direction 510, while tunneling occurs along a second direction 512. This is called line-tunneling.

FIG. 5B illustrates band diagrams, 514 and 522, showing operation of intra-band tunnel FET 500. As shown in band diagrams, 514 and 522, the source region 502 has a first band gap, the channel region 504 has a second band gap, and the drain region 506 has a third band gap, wherein the second band gap is larger than the first and third band gaps.

Band diagram 514 illustrates n-type intra-band tunnel FET 500 in an "on-state." In the on-state, the conduction band offset CBO between the source region 502 and the channel region 504 and between the drain region 506 and the channel region 504 is relatively small resulting in a low electron energy barrier between source 502 and drain 506. The relatively low electron energy barrier allows for electrons to quantum mechanically tunnel between the conduction band CB in the source region 502 and the conduction band CB in the drain region 506, by way of the channel region 504. The valance band offset VBO between the source region 502 and the channel region 504 and between the drain region 506 and the channel region 504 is relatively large (i.e., larger than the CBO) resulting in a high hole energy barrier between source 502 and drain 506. The relatively high hole energy barrier prevents holes from quantum mechanically tunneling between the valence band VB in the source region 502 and the valence band VB in the drain region 506, by way of the channel region 504 (i.e., so that electrons act as charge carriers in the n-type intra-band tunnel FET 500).

As shown in band diagram 522, in an "off-state", a bias voltage is applied to the gate region 508, causing the gate region 508 to generate an electric field. The electric field changes the position of the conduction band CB and the valence band VB in the channel region 504 and in the drain region 506. The change in the position of the conduction band CB prevents electrons from quantum mechanically tunneling between the source region 502 and the drain region 506, by way of the channel region 504.

Figure 6A:
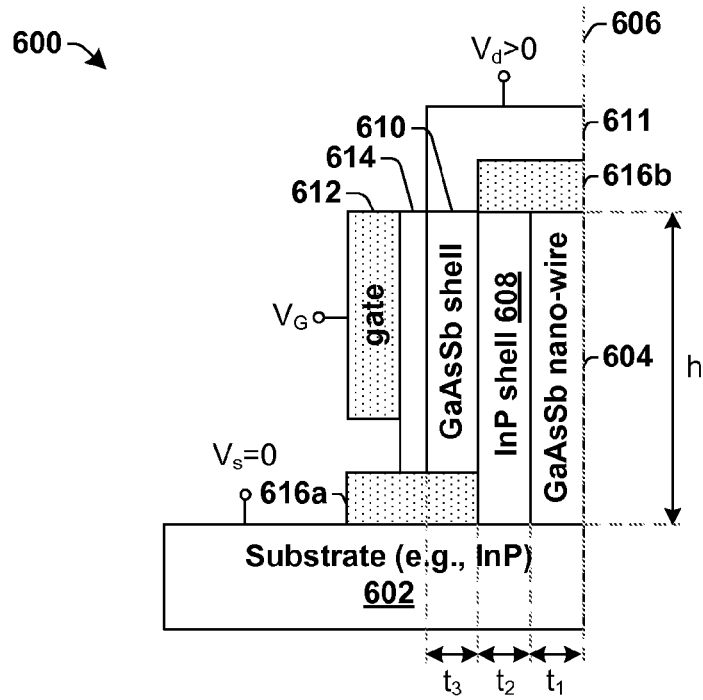
FIGS. 6A-6B illustrates some embodiments of a disclosed intra-band tunnel FET comprising nanowires.
Figure 6B:
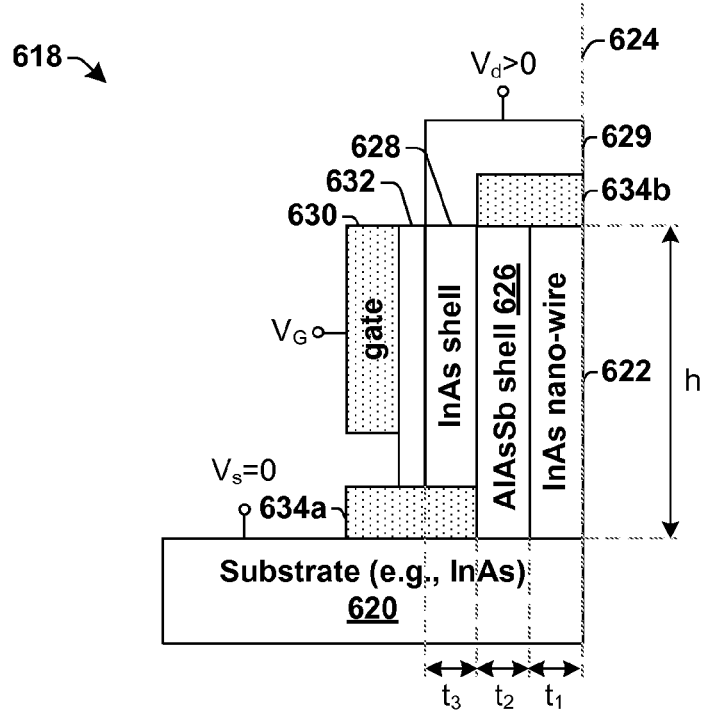

FIGS. 6A-6B illustrates some embodiments of intra-band tunnel FETs, 600 and 618, configured to perform line tunneling.

FIG. 6A illustrates an n-type intra-band tunnel FET 600 configured to perform line tunneling. The n-type intra-band tunnel FET 600 comprises an n-doped source region comprising a semiconductor body 604 disposed on a substrate 602. In some embodiments, the semiconductor body 604 may comprise a nanowire 604 may be positioned to extend along an axis of rotation 606 that is normal to the substrate and may have a radius $t_1$ that is in a range of between approximately 20 nm and approximately 100 nm. The nanowire 604 has a height h, which is much greater than the radius $t_1$. In some embodiments, the nanowire 604 may comprise a gallium arsenide antimonide (GaAsSb) nanowire formed onto an indium phosphide (InP) substrate.

A channel region 608 is disposed adjacent to the nanowire 604. In some embodiments, the channel region 608 comprises a concentric shell that covers outer edges of the nanowire 604. The channel region 608 is located at a position that is radially outside of the nanowire 604 (i.e., that is positioned at a larger radius from the axis of rotation than the nanowire 604). In some embodiments, the channel region 608 may comprise an intrinsic doping concentration, while in other embodiments the channel region 608 may comprise an n-type or a p-type doping concentration. The channel region 608 may have a thickness $t_2$ that is in a range of between approximately 4 nm and approximately 10 nm. In some embodiments, the channel region 608 may comprise indium phosphide (InP).

An n-doped drain region 610 is disposed adjacent to the channel region 608 at a position that is radially outside of the channel region 608. In some embodiments, the drain region 610 comprises a concentric shell that covers the nanowire 604 and the channel region 608. In some embodiments, the drain region 610 may have a thickness $t_3$ that is in a range of between approximately 4 nm and approximately 10 nm. In some embodiments, the drain region 610 may comprise gallium arsenide antimonide (GaAsSb).

A gate region 612 is located radially outside of the n-doped drain region 610. The gate region 612 may be separated from the n-doped drain region 610 by a gate dielectric layer 614.

First and second spacers, 616a and 616b, are configured to prevent undesired electrical conduction between the substrate 602 and the n-doped drain region 610, and between n-doped nanowire 604 (i.e., source) and the n-doped drain region 610, respectively. For example, spacer 616a is situated between the substrate 602 and the n-doped drain region 610, and spacer 616b is situated between nanowire 604 and channel layer 608 on one side and drain contact 611 (electrically connected to the n-doped drain region 610) on the other side. In some embodiments, the first and second spacers, 616a and 616b, may comprise a dielectric material (e.g., an oxide).

FIG. 6B illustrates a p-type intra-band tunnel FET 618 configured to perform line tunneling. The p-type intra-band tunnel FET 618 comprises a p-doped source region comprising a nanowire 622 disposed on a substrate 620. In some embodiments, the nanowire 622 may be positioned along an axis of rotation 624 and may have a radius $t_1$ that is in a range of between approximately 20 nm and approximately 100 nm. The nanowire 622 has a height h, which is much greater than the radius $t_1$. In some embodiments, the nanowire 622 may comprise an indium arsenide (InAs) nanowire formed onto an indium arsenide (InAs) substrate.

A channel region 626 is disposed adjacent to the nanowire 622. In some embodiments, the channel region 626 comprises a concentric shell that covers outer edges of the nanowire 622. The channel region 626 is located at a position that is radially outside of the nanowire 622. In some embodiments, the channel region 608 may comprise an intrinsic doping concentration, while in other embodiments the channel region 608 may comprise an n-type or a p-type doping concentration. The channel region 626 may have a thickness $t_2$ that is in a range of between approximately 4 nm and approximately 10 nm. In some embodiments, the channel region 608 may comprise aluminum arsenide antimonide (AlAsSb).

A p-doped drain region 628 is disposed adjacent to the channel region 626 at a position that is radially outside of the channel region 626. In some embodiments, the drain region 628 may have a thickness $t_3$ that is in a range of between approximately 4 nm and approximately 10 nm. In some embodiments, the drain region 628 may comprise indium arsenide (InAs).

A gate region 630 is located radially outside of the p-doped drain region 628. The gate region 630 may be separated from the p-doped drain region 628 by a gate dielectric layer 632.

First and second spacers, 634a and 634b, are configured to prevent undesired electrical conduction between the substrate 620 and the p-doped drain region 628, and between p-doped nanowire 622 (i.e., source) and the p-doped drain region 628, respectively. For example, spacer 634a is situated between the substrate 620 and the p-doped drain region 628, and spacer 616b is situated between p-doped nanowire 622 and channel layer 626 on one side and drain contact 629 (electrically connected to the p-doped drain region 628) on the other side. In some embodiments, the first and second spacers, 634a and 634b, may comprise a dielectric material (e.g., an oxide).

Figure 7:
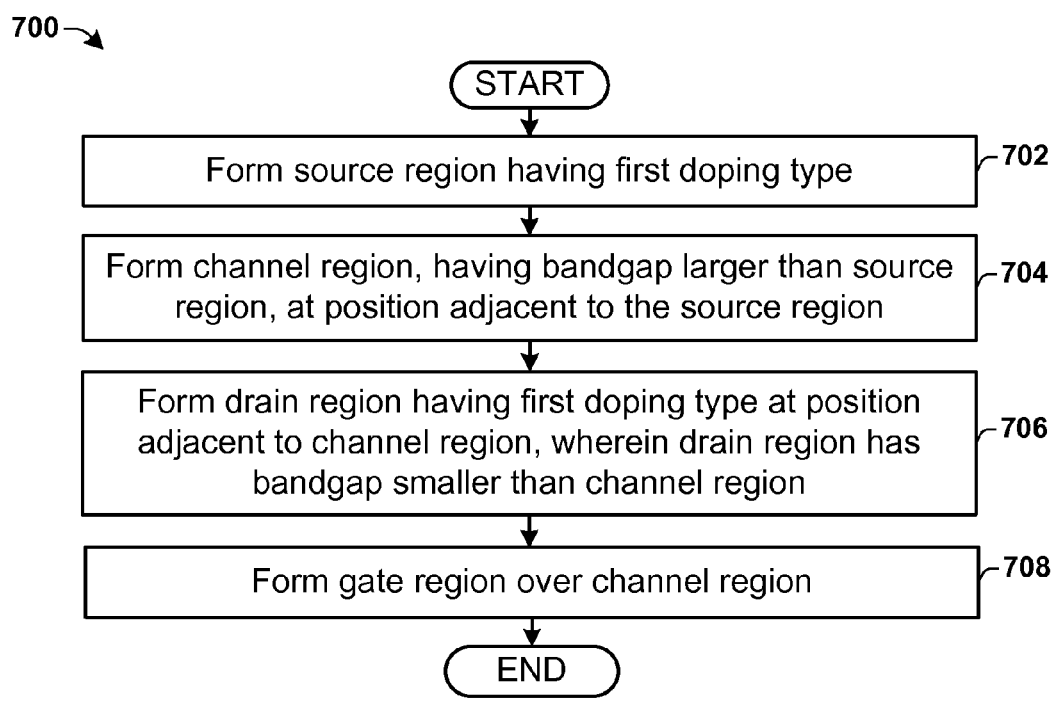
FIG. 7 is a flow diagram of some embodiments of a method of forming a disclosed intra-band tunnel FET.

FIG. 7 is a flow diagram of some embodiments of a method 700 of forming a disclosed intra-band tunnel FET.

While the disclosed method 700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 702, a source region having a first doping type is formed. In some embodiments, the source region is grown onto a substrate using a deposition process. The deposition process may comprise a physical vapor deposition or a chemical vapor deposition (HVCVD, MOCVD, etc.), for example.

At act 704, a channel region is formed at a position adjacent to the source region. In some embodiments, the channel region is formed onto the source region by a deposition process comprising a physical vapor deposition or a chemical vapor deposition (HVCVD, MOCVD, etc.), for example. In some embodiments, the channel region has a similar lattice constant to the source region (e.g., the source and channel regions are lattice matched), so that the channel region can be grown onto the source region without defects.

The channel region has a larger band gap than the source region. The larger band gap causes the channel region to form a heterojunction with the source region. In some embodiments, the channel region may comprise an intrinsic doping concentration, while in other embodiments the channel region may have a first doping type (e.g., a n-type doping) or a second doping type (e.g., a p-type doping).

At act 706, a drain region having the first doping type is formed at a position adjacent to the channel region. In some embodiments, the drain region is formed onto the channel region by a deposition process comprising a physical vapor deposition or a chemical vapor deposition (HVCVD, MOCVD, etc.), for example. In some embodiments, the drain region has a similar lattice constant to the channel region (e.g., the channel and drain regions are lattice matched), so that the drain region can be grown onto the channel region without defects.

The drain region has a smaller band gap than the channel region. The smaller band gap causes the channel region to form a double heterojunction with the source region and the drain region. The formation of the double heterojunction at the interface between the source and channel region and at the interface of the drain and channel region results in an energy barrier between the source region and the drain region. The energy barrier is asymmetric such that is has a first offset value for a conduction band (i.e., a conduction band offset) and a different, second offset value for a valence band (i.e., a valence band offset).

In some embodiments, wherein the tunnel FET comprises an n-type tunnel FET, the bandgap difference of the channel region and the source/drain regions forms a conduction band offset that is smaller than the valence band offset. In other embodiments, wherein the tunnel FET comprises a p-type tunnel FET, the bandgap difference of the channel region and the source/drain region forms a conduction band offset that is larger than the valence band offset.

At act 708, a gate region is formed over the channel region. The gate region is configured to generate an electric field that changes the position of the conduction band and the valence band in the channel region. By changing the position of the conduction band and the valence band in the channel region, the electron and hole barriers can be varied. By varying the electron and hole barriers quantum mechanical tunneling from the source region to the drain region within an energy band (e.g., within a conduction band or within a valence band) can be effectively controlled.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to an intra-band tunnel FET, which comprises a symmetric tunnel FET that is able to provide for a high drive current.

In some embodiments, the present disclosure relates to an intra-band tunnel field effect transistor (TFET) device. The intra-band TFET device comprises a source region separated from a drain region by a channel region wherein the source region, the drain region, and the channel region have energy bands that form energy barriers between the source region and the drain region having a conduction band offset that is different from a valence band offset. A gate region is configured to generate an electric field that varies the energy barriers to selectively allow quantum mechanical tunneling of electrons within a conduction band, or to selectively allow quantum mechanical tunneling of holes within the valence band.

In other embodiments, the present disclosure relates to an intra-band tunnel field effect transistor (TFET) device. The intra-band TFET device comprises a source region comprising a source compound having two or more semiconductor elements, wherein the source region has a first doping type and a first band gap value. The intra-band TFET device further comprises a drain region comprising a drain compound having two or more semiconductor elements, wherein the source region has the first doping type and a second band gap value. The intra-band TFET device further comprises a channel region comprising a channel compound having two or more semiconductor elements that is located between the source region and the drain region and having a third band gap value larger than the first band gap value and the second band gap value, wherein the third bandgap value forms an energy barrier between the source region and the drain region. The intra-band TFET device further comprises a gate region configured to generate an electric field that controls quantum mechanical tunneling of charge carries between the conduction band in the source region and in the drain region or between the valence band in the source region and in the drain region.

In other embodiments, the present disclosure relates to method of forming an intra-band tunnel field effect transistor. The method comprises forming a source region having first doping type. The method further comprises forming drain region having first doping type. The method further comprises forming a channel region positioned between source region and drain region. The method further comprises forming gate region configured to generate an electric field that controls quantum mechanical tunneling of electrons or holes between the source region and the drain region. The source region, the drain region, and the channel region have a conduction band offset that is different from a valence band offset so as to form energy barriers between the source region and the drain region that selectively allows quantum mechanical tunneling of electrons within a conduction band, or that selectively allows quantum mechanical tunneling of holes within the valence band.

What is claimed is:

1. An intra-band tunnel field effect transistor (TFET) device, comprising:
   a source region separated from a drain region by a channel region, wherein the source region, the drain region, and the channel region comprise materials with energy bands having bandgaps with values that form a conduction band between the source region and the drain region and a valence band between the source region and the drain region, wherein the conduction band has only one conduction band energy barrier between the source region and the drain region that is different than an only valence band energy barrier within the valence band between the source region and the drain region; and
   a gate region configured to generate an electric field that varies the conduction band energy barrier and the valence band energy barrier to selectively allow quantum mechanical tunneling of electrons within the conduction band or to selectively allow quantum mechanical tunneling of holes within the valence band.

2. The intra-band TFET device of claim 1, wherein heights of the conduction band energy barrier or the valence band energy barrier are configured to change when a voltage bias is applied to the gate region.

3. The intra-band TFET device of claim 2,
   wherein the gate region has a length in a direction parallel to a flow of charge carriers within the channel region that is in a range of between approximately 4 nm and approximately 10 nm.

4. The intra-band TFET device of claim 1,
   wherein the channel region comprises a channel material having first doping type that is an n-type doping or a p-type doping, and the source region and the drain region comprise a material having a second doping type that is different than the first doping type and that is the n-type doping or the p-type doping.

5. The intra-band TFET device of claim 1, wherein the conduction band energy barrier has a conduction band offset with a value in a range of between approximately 0.1 eV (electron-volt) and approximately 0.2 eV and wherein the valence band energy barrier has a valence band offset with a value that is greater than approximately 0.5 eV.

6. The intra-band TFET device of claim 1,
   wherein the source region and the drain region have a n-type doping concentration; and
   wherein the valence band energy barrier between the source region and the channel region is at least twice as large as the conduction band energy barrier between the source region and the channel region.

7. The intra-band TFET device of claim 6,
   wherein the source region and the drain region comprise gallium arsenide or gallium arsenide antimonide; and
   wherein the channel region comprises aluminum arsenide, zinc selenide, or indium phosphide.

8. An intra-band tunnel field effect transistor (TFET) device, comprising:
   a source region comprising a source compound having two or more semiconductor elements, wherein the source region has a first doping type and a first band gap value;
   a drain region comprising a drain compound having two or more semiconductor elements, wherein the drain region has the first doping type and a second band gap value;
   a channel region comprising a channel compound having two or more semiconductor elements that is located between the source region and the drain region and having a third band gap value larger than the first band gap value and the second band gap value, wherein the third band gap value forms an energy barrier between the source region and the drain region; and
   a gate region configured to generate an electric field that controls quantum mechanical tunneling of charge carries between a conduction band in the source region and in the drain region or between a valence band in the source region and in the drain region.

9. The intra-band TFET device of claim 8, wherein the gate region is located between the source region and the drain region at a position that is over the channel region and has a gate length that is in a range of between approximately 4 nm and approximately 10 nm.

10. The intra-band TFET device of claim 8,
    wherein the source region and the drain region comprise two or more semiconductor elements from the group consisting of gallium arsenide and gallium arsenide antimonide.

11. An intra-band tunnel field effect transistor (TFET) device, comprising:
    a source region having a first doping type and a first energy bandgap;
    a drain region having the first doping type and a second energy bandgap;
    a channel region disposed between the source region and the drain region and having an energy band-gap that is larger than the first and second energy bandgaps, so as to provide for conduction band offsets between a conduction band of the channel region and conduction bands of the source region and the drain region that are greater than zero, and that provides for valence band offsets between a valence band of the channel region and valence bands of the source region and the drain region that are greater than zero; and
    a gate region that is separated from the channel region by a gate dielectric layer and that is configured to generate an electric field that controls quantum mechanical tunneling of charge carries between the conduction bands of the source region and the drain region or between the valence bands of the source region and the drain region.

12. The intra-band TFET device of claim 11, wherein the conduction band offsets are at least twice as large as the valence band offsets.

13. The intra-band TFET device of claim 12, wherein the conduction band offsets have a value in a range of between approximately 0.1 eV (electron-volt) and approximately 0.2 eV and wherein the valence band offsets have a value that is greater than approximately 0.5 eV.

14. The intra-band TFET device of claim 11, wherein the source region and the drain region have an n-type doping concentration.

15. The intra-band TFET device of claim 14,
    wherein the source region and the drain region comprise gallium arsenide or gallium arsenide antimonide; and
    wherein the channel region comprises aluminum arsenide, zinc selenide, or indium phosphide.

16. The intra-band TFET device of claim 11, wherein the source region and the drain region comprise a same material.

17. The intra-band TFET device of claim 11, wherein the channel region comprises the first doping type.

18. The intra-band TFET device of claim 11,
wherein the gate region has a length in a direction parallel to a flow of charge carriers within the channel region; and
wherein the channel region has a thickness that is in a direction perpendicular to the flow of charge carriers within the channel region, which is greater than or equal to the length.

19. The intra-band TFET device of claim 18, wherein the length has a value that is in a range of between approximately 4 nm and approximately 10 nm.

20. The intra-band TFET device of claim 19, wherein the thickness has a value that is in a range of between approximately 4 nm and approximately 40 nm.

21. An intra-band tunnel field effect transistor (TFET) device, comprising:
a source region separated from a drain region by a channel region, wherein the source region, the drain region, and the channel region comprise materials with energy bands having bandgaps with values that form a conduction band energy barrier within a conduction band between the source region and the drain region and a valence band energy barrier within a valence band between the source region and the drain region, wherein the conduction band energy barrier has a conduction band offset that is different from a valence band offset of the valence band energy barrier;
a gate region configured to generate an electric field that varies the conduction band energy barrier and the valence band energy barrier to selectively allow quantum mechanical tunneling of electrons within a conduction band or to selectively allow quantum mechanical tunneling of holes within the valence band;
wherein the source region and the drain region have a n-type doping concentration; and
wherein the valence band offset between the source region and the channel region is at least twice as large as the conduction band offset between the source region and the channel region.

* * * * *